(12) United States Patent
Altecor (10) Patent No.: US 12,140,208 B2
(45) Date of Patent: Nov. 12, 2024

(54) TOOL AND METHOD FOR CHANDELIER SHOWERHEAD INSTALLATION

(71) Applicant: Lam Research Corporation, Fremont, CA (US)

(72) Inventor: Aleksey V. Altecor, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/013,731

(22) PCT Filed: Jun. 24, 2021

(86) PCT No.: PCT/US2021/038982
§ 371 (c)(1),
(2) Date: Dec. 29, 2022

(87) PCT Pub. No.: WO2022/005878
PCT Pub. Date: Jan. 6, 2022

(65) Prior Publication Data
US 2023/0235813 A1    Jul. 27, 2023

Related U.S. Application Data

(60) Provisional application No. 62/705,522, filed on Jul. 1, 2020.

(51) Int. Cl.
*F16H 25/24*     (2006.01)
*C23C 16/455*    (2006.01)
*F16H 25/20*     (2006.01)

(52) U.S. Cl.
CPC ....... *F16H 25/24* (2013.01); *C23C 16/45565* (2013.01); *F16H 2025/2053* (2013.01); *F16H 2025/2062* (2013.01)

(58) Field of Classification Search
CPC ............... F16H 2025/2053; C23C 16/455
See application file for complete search history.

(56) References Cited

U.S. PATENT DOCUMENTS

| | | | |
|---|---|---|---|
| 8,225,698 B2 * | 7/2012 | Yang | B25B 17/02 |
| | | | 81/55 |
| 2009/0165279 A1 | 7/2009 | Bockemehl, Jr. et al. | |
| 2011/0036206 A1 | 2/2011 | Yang | |

FOREIGN PATENT DOCUMENTS

| | | | |
|---|---|---|---|
| CA | 3134657 A1 * | 10/2020 | F16H 1/36 |
| CN | 208203945 U * | 12/2018 | |

(Continued)

OTHER PUBLICATIONS

English Translation of CN_208203945_U (Year: 2018).*
(Continued)

*Primary Examiner* — Jacob J Cigna
(74) *Attorney, Agent, or Firm* — Schwegman Lundberg & Woessner, P.A.

(57) ABSTRACT

An alignment device is provided to draw two components together in an aligned configuration. An example alignment device comprises a planetary gear set including a ring gear and at least two planetary gears and one or more side plates for supporting the gears. Each of the planetary gears includes an aperture sized to receive a threaded fastener for engagement with a respective threaded rod that is engaged with one of the two components, wherein rotation of the ring gear imparts rotational movement to the threaded fasteners to cause synchronized advancement of the alignment device along the threaded rods.

26 Claims, 6 Drawing Sheets

(56) References Cited

FOREIGN PATENT DOCUMENTS

| | | |
|---|---|---|
| CN | 115835937 | 3/2023 |
| JP | 2023532506 | 7/2023 |
| KR | 20030090186 A | 11/2003 |
| KR | 20150132760 A | 11/2015 |
| WO | WO-2022005878 A1 | 1/2022 |

OTHER PUBLICATIONS

International Application Serial No. PCT/US2021/038982, International Search Report mailed Oct. 19, 2021, 3 pgs.
International Application Serial No. PCT/US2021/038982, Written Opinion mailed Oct. 19, 2021, 4 pgs.
"International Application Serial No. PCT US2021 038982, International Preliminary Report on Patentability mailed Jan. 12, 2023", 6 pgs.
"Japanese Application Serial No. 2022-580734, Voluntary Amendment filed May 28, 2024", w English claims, 12 pgs.

* cited by examiner

TOOL AND METHOD FOR CHANDELIER SHOWERHEAD INSTALLATION

CLAIM OF PRIORITY

This application is a U.S. National Stage Filing under 35 U.S.C. 371 from International Application No. PCT/US2021/038982, filed on Jun. 24, 2021, and published as WO 2022/005878 A1 on Jan. 6, 2022, which claims the benefit of priority under 35 U.S.C. § 120 to U.S. Patent Application Ser. No. 62/705,522, filed on Jul. 1, 2020, each of which is incorporated by reference herein in its entirety.

FIELD

The present disclosure relates generally to a tool and method for chandelier showerhead installation, and more particularly to an alignment device and toolkit that enable precision installation of heavy chandelier-style showerheads.

BACKGROUND

In some current semiconductor manufacturing operations, showerheads are installed manually and rely on alignment of a key lock feature in the showerhead and cooling plates. The manual installation process typically produces damage on the thermal interface between these two parts, significantly affecting heat transfer and limiting tool performance (up to 30% less heat transfer, which affects total tool throughput and process capability). The keying feature is often too small to handle the increased mass of new showerheads and also results in increased damage and debris generation when used with newer generation showerheads.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

BRIEF SUMMARY

The present disclosure relates generally to a tool and method for chandelier showerhead installation, and more particularly to a manually-operated "synchro-puller" gearbox and alignment toolkit that enables precision installation of heavy chandelier showerheads. When configuring or installing a showerhead in a processing chamber, some examples restrict movement of the showerhead relative to a cooling plate in a single dimension (e.g., towards or away from one another, but not laterally) to allow the two surfaces to come in contact in almost perfect parallelism, without other nearby surfaces rubbing or interfering with a desired alignment. Some example gearboxes include a planetary gear set to synchronize and drive two threaded rods that impart aligned, axial movement to a component, such as a showerhead or a cooling plate. In some examples, the threaded rods are removable after the showerhead has been positioned and fastened into its final installed position. Some example gearboxes include thrust bearings to route the weight load of the showerhead to the same load-bearing components that carry this weight during a regular service. Some example gearboxes include self-aligning gears to minimize backlash and friction.

In some examples, an alignment device is provided to draw two components together in an aligned manner. An example alignment device comprises a planetary gear set, the planetary gear set comprising a ring gear and at least two planetary gears; and one or more side plates for supporting the ring gear and the at least two planetary gears; wherein each of the at least two planetary gears includes an aperture sized to receive a threaded fastener for engagement with a respective one of at least two threaded rods engaged with one of the two components, wherein rotation of the ring gear imparts synchronized rotational movement to the threaded fasteners to cause linear movement of the alignment device relative to the at least two threaded rods.

Some examples further comprise a pair of shoe retainers for supporting the at least two planetary gears. The pair of shoe retainers may be configured to support the at least two planetary gears for rotation inside the ring gear and around a respective one of the at least two threaded rods, devoid of a sun gear.

In some examples, the alignment device is portable, and the ring gear includes one or more manually engageable formations provided on a periphery thereof for rotating the ring gear by hand to move the alignment device relative to the at least two threaded rods.

Some examples further comprise one or more thrust bearings to support a weight of one of the two components or to transmit an axial force generated by the alignment device upon rotation of the ring gear to one of the two components.

In some examples, the one or more side plates include first apertures to allow passage therethrough of the at least two threaded rods, and one or more second apertures to allow passage of a securement fastener to fasten the two components together.

In some examples, the ring gear and at least two planetary gears include herringbone gears.

In some examples, a first component of the two components includes a showerhead and a second component of the two components includes a cooling plate.

In some examples, an alignment toolkit is provided to facilitate drawing two components together in an aligned manner. An example toolkit comprises at least two threaded rods, with each engageable with one of the two components; and an alignment device, the alignment device comprising: a planetary gear set, the planetary gearbox comprising a ring gear and at least two planetary gears and one or more side plates for supporting the ring gear and the at least two planetary gears; wherein each of the at least two planetary gears includes an aperture sized to receive a threaded fastener for engagement with a respective one of the at least two threaded rods, wherein rotation of the ring gear imparts synchronized rotational movement to the threaded fasteners to cause linear movement of the alignment device relative to the at least two threaded rods.

In some examples, the toolkit further comprises a threaded-rod guide for engagement with one of the two components.

In some examples, the toolkit further comprises an alignment checker to check or confirm an alignment of the two components as they are drawn together.

In some examples, the alignment device further comprises a pair of shoe retainers for supporting the at least two planetary gears. In some examples, the pair of shoe retainers is configured to support the at least two planetary gears for rotation inside the ring gear and around a respective one of the at least two threaded rods, devoid of a sun gear.

In some examples, the alignment device is portable, and the ring gear includes one or more manually engageable formations provided on a periphery thereof for rotating the ring gear by hand to move the alignment device relative to the at least two threaded rods.

In some examples, the alignment device further comprises one or more thrust bearings to support a weight of one of the two components or to transmit an axial force generated by the alignment device upon rotation of the ring gear to one of the two components.

In some examples, the one or more sides plates of the alignment device includes first apertures to allow passage of the respective threaded rods and one or more second apertures to allow passage of a securement fastener to fasten the two components together.

In some examples, the ring gear and at least two planetary gears of the alignment device include herringbone gears.

In some examples, a first component of the two components includes a showerhead and a second component of the two components includes a cooling plate.

In some examples, a method is provided for aligning two components to be drawn together. An example method comprises connecting two or more threaded rods to a first of the two components; engaging an alignment device with a second of the two components, the alignment device comprising a planetary gear set comprising a ring gear and at least two planetary gears, the alignment device comprising one or more side plates for supporting the ring gear and the at least two planetary gears, wherein each of the at least two planetary gears includes an aperture sized to receive a threaded fastener for engagement with one of the two or more threaded rods, wherein rotation of the ring gear imparts synchronized rotational movement to the threaded fasteners to cause linear movement of the alignment device relative to the two or more threaded rods; and rotating the ring gear to move the alignment device relative to the two or more threaded rods.

In some examples, the method further comprises engaging a threaded-rod guide with one of the two components.

In some examples, the method further comprises using an alignment checker to check or confirm an alignment of the two components as they are drawn together.

In some examples of the method, the alignment device further comprises a pair of shoe retainers for supporting the at least two planetary gears. In some examples, the pair of shoe retainers is configured to support the at least two planetary gears for rotation inside the ring gear and around a respective one of the two or more threaded rods, devoid of a sun gear.

In some examples of the method, the alignment device is portable, and the ring gear includes one or more manually engageable formations provided on a periphery thereof for rotating the ring gear by hand to advance the device along the two or more threaded rods, and wherein the method further comprises rotating the ring gear by hand to move the alignment device along the two or more threaded rods.

In some examples of the method, the alignment device further comprises one or more thrust bearings to support a weight of one of the two components, or to transmit an axial force generated by the alignment device upon rotation of the ring gear to one of the two components.

In some examples of the method, the one or more side plates of the alignment device include first apertures to allow passage therethrough of the two or more threaded rods, and one or more second apertures to allow passage of a securement fastener to fasten the two components together, and wherein the method further comprises passing a securement fastener through one of the second apertures and fastening the components together.

In some examples of the method, the ring gear and at least two planetary gears of the alignment device include herringbone gears.

In some examples of the method, a first component of the two components includes a showerhead and a second component of the two components includes a cooling plate.

BRIEF DESCRIPTION OF THE SEVERAL VIEWS OF THE DRAWINGS

Some embodiments are illustrated by way of example and not limitation in the views of the accompanying drawings.

DETAILED DESCRIPTION

The description that follows includes systems, methods, techniques, instruction sequences, and computing machine program products that embody illustrative embodiments of the present disclosure. In the following description, for purposes of explanation, numerous specific details are set forth in order to provide a thorough understanding of example embodiments. It will be evident, however, to one skilled in the art that the present disclosure may be practiced without these specific details.

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright Lam Research Corporation, 2020, All Rights Reserved.

Figure 1:
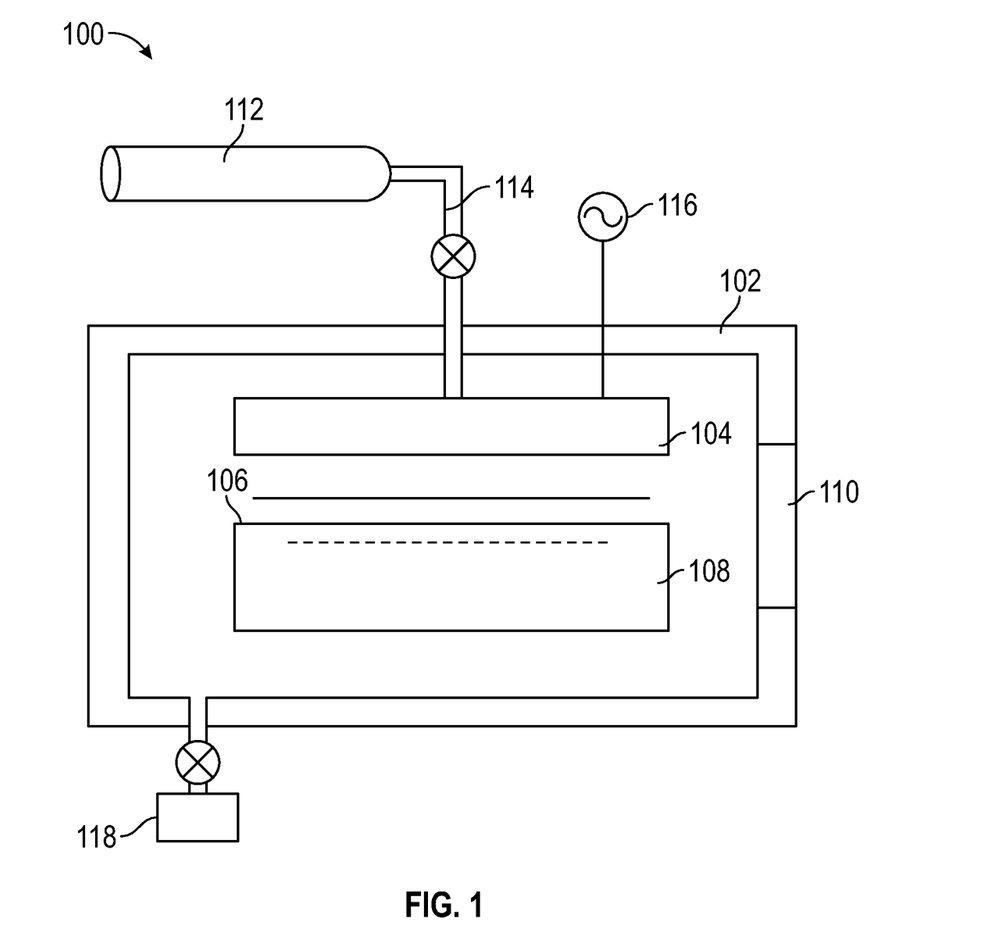
FIG. 1 shows example arrangement of a processing chamber within which some examples of the present disclosure may be employed, according to some example embodiments.

With reference now to FIG. 1, an example arrangement 100 of a plasma-based processing chamber is shown. The present subject matter may be used in a variety of semiconductor manufacturing and wafer processing operations, but in the illustrated example, the plasma-based processing chamber is described in the context of plasma-enhanced or radical-enhanced Chemical Vapor Deposition (CVD) or Atomic Layer Deposition (ALD) operations. The skilled artisan will also recognize that other types of ALD processing techniques are known (e.g., thermal-based ALD operations) and may incorporate a non-plasma-based processing chamber. An ALD tool is a specialized type of CVD processing system in which ALD reactions occur between two or more chemical species. The two or more chemical species are referred to as precursor gases and are used to form a thin film deposition of a material on a substrate, such as a silicon wafer as used in the semiconductor industry. The precursor gases are sequentially introduced into an ALD processing chamber and react with a surface of the substrate to form a deposition layer. Generally, the substrate repeatedly interacts with the precursors to deposit slowly an increasingly thick layer of one or more material films on the substrate. In certain applications, multiple precursor gases may be used to form various types of film or films during a substrate manufacturing process.

FIG. 1 is shown to include a plasma-based processing chamber 102 in which a showerhead 104 and a substrate-support assembly 108 or pedestal are disposed. The showerhead 104 may be a showerhead electrode or a chandelier showerhead of the type described more fully below. The showerhead 104 may be positioned adjacent to or in association with a cooling plate (not shown in FIG. 1, but described below). The pedestal or substrate-support assembly 108 may include an indexing head. Typically, the substrate-support assembly 108 seeks to provide a substantially-isothermal surface and may serve as both a heating element and a heat sink for a substrate 106. The substrate-support assembly 108 may comprise an Electrostatic Chuck (ESC) in which heating elements are included to aid in processing the substrate 106, as described above. The substrate 106 may include a wafer comprising, for example, elemental-semiconductor materials (e.g., silicon (Si) or germanium (Ge)) or compound-semiconductor materials (e.g., silicon germanium (SiGe) or gallium arsenide (GaAs)). Additionally, other substrates include, for example, dielectric materials such as quartz, sapphire, semi-crystalline polymers, or other non-metallic and non-semiconductor materials.

In operation, the substrate 106 is loaded through a loading port 110 onto the substrate-support assembly 108. A gas line 114 can supply one or more process gases (e.g., precursor gases) to the showerhead 104. In turn, the showerhead 104 delivers the one or more process gases into the plasma-based processing chamber 102. A gas source 12 (e.g., one or more precursor gas ampules) to supply the one or more process gases is coupled to the gas line 114. In some examples, a radio frequency (RF) power source 116 is coupled to the showerhead 104. In other examples, a power source is coupled to the substrate-support assembly 108 or ESC.

Prior to entry into the showerhead 104 and downstream of the gas line 114, a point-of-use (POU) and manifold combination (not shown) controls entry of the one or more process gases into the plasma-based processing chamber 102. In the case of a plasma-based processing chamber 102 being used to deposit thin films in a plasma-enhanced ALD operation, precursor gases may be mixed in the showerhead 104.

In operation, the plasma-based processing chamber 102 is evacuated by a vacuum pump 118. RF power is capacitively coupled between the showerhead 104 and a lower electrode (not shown explicitly) contained within or on the substrate-support assembly 108. The substrate-support assembly 108 is typically supplied with two or more RF frequencies. For example, in various embodiments, the RF frequencies may be selected from at least one frequency at about 1 MHz, 2 MHz, 13.56 MHz, 27 MHz, 60 MHz, and other frequencies as desired. A coil designed to block or partially block a particular RF frequency can be designed as needed. Therefore, particular frequencies discussed herein are provided merely for ease in understanding. The RF power is used to energize the one or more process gases into a plasma in the space between the substrate 106 and the showerhead 104. The plasma can assist in depositing various layers (not shown) on the substrate 106. In other applications, the plasma can be used to etch device features into the various layers on the substrate 106. RF power is coupled through at least the substrate-support assembly 108. The substrate-support assembly 108 may have heaters (not shown in FIG. 1) incorporated therein. The detailed design of the plasma-based processing chamber 102 may vary.

As mentioned above, in some current semiconductor manufacturing operations, showerheads are installed manually and rely on alignment of a key lock feature in the showerhead and associated cooling plate. The manual installation process typically produces damage on the thermal interface between these two parts, significantly affecting heat transfer and limiting tool performance (up to 30% less heat transfer, which affects total tool throughput and process capability). The keying feature is often too small to handle the increased mass of new showerheads and also results in increased damage and debris generation when used with newer generation showerheads.

In order to address these issues, some examples herein facilitate the alignment of two components, such as a showerhead and a cooling plate, as they are drawn together. Some examples restrict movement of the two components relative to each other to a single dimension (for example, towards or away from one another) to allow the mating surfaces of the two components to come into contact with each other in almost perfect parallelism, without other adjacent component surfaces rubbing or interfering with the alignment operations. Some examples include an alignment device comprising a planetary gear set (or gearbox) to synchronize and drive two threaded rods which interconnect the alignment device and one of the two components. In some examples, the two threaded rods are removable after the showerhead has been positioned and fastened to the cooling plate in its final installed position. The alignment device utilizes thrust bearings in conjunction with the gear set to route the weight load of the showerhead to the same load-bearing components that carry the weight during regular service, and self-aligning gears (for example, herringbone gears) to minimize backlash and friction.

Precision installation facilitated by an example alignment device enables much more polished component surfaces to come in contact without damage and without the use of thermal grease, in some cases. This increased thermal contact enables up to 30% more heat transfer across the joint, increasing overall tool performance and, in some examples, enabling higher deposition rates due to higher powers. Some examples also enable a reduction in the number of service personnel to perform a component installation (for example, enabling a reduction in service personnel from 2 to 3 people to one person)

Figure 2:
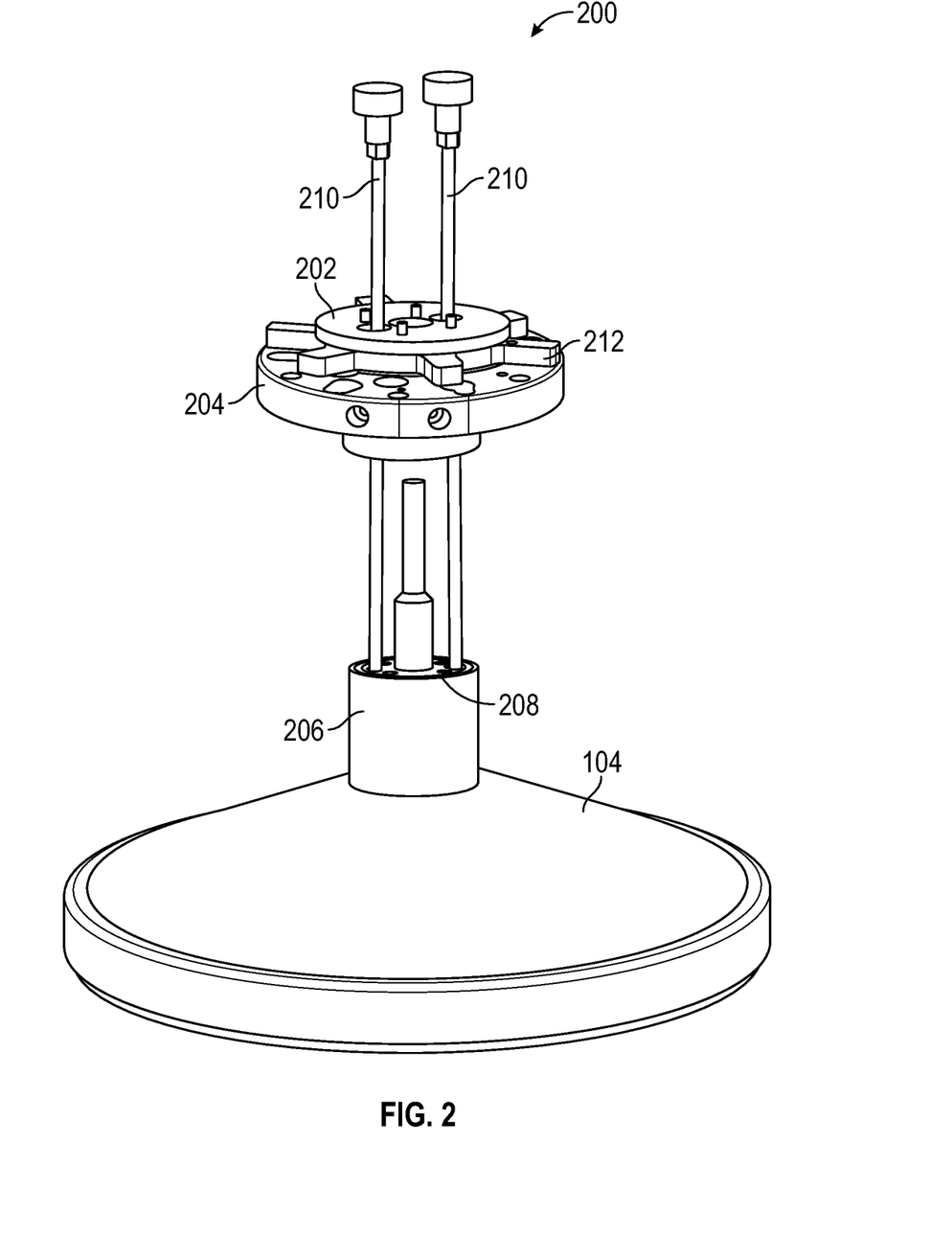
FIG. 2 illustrates an assembly of an alignment device, a showerhead, and a cooling plate, in accordance with one embodiment.

With reference to FIG. 2, an assembly 200 is illustrated in which two components are sought to be drawn together and then fastened to each other in a final position. In the illustrated example, a first component of the two components is a cooling plate 204 and a second component of the two components is a showerhead 104. Alignment of other components is possible using the components and techniques disclosed herein. The showerhead 104 has a showerhead stem 206. The showerhead stem 206 includes a number of threaded holes 208 for securing the cooling plate 204 to the showerhead 104 by means of one or more complementally-threaded securement fasteners (not shown). In the illustrated assembly 200, each of a pair of threaded rods 210 is connected to the showerhead stem 206 at a lower end thereof by being screwed into a pair of respective threaded holes 208. Other numbers of the threaded rods 210 and configurations thereof are possible.

As is described more fully below, an alignment device 202 is engaged with the threaded rods 210. The alignment device 202 is portable (i.e. carriable by hand) and includes a manually operable ring gear 212 to advance the alignment device 202 along the threaded rods 210 in one restricted linear direction or another (i.e., up or down in the view). As the alignment device 202 is connected to the cooling plate 204, upon manual rotation of the ring gear 212, the showerhead 104 and cooling plate 204 can be drawn together (or moved apart from one another if the ring gear 212 is rotated in the opposite direction) in an aligned fashion. Movement of the alignment device 202 along each of the pair of threaded rods 210 is synchronized as will be described more fully below.

Figure 3:
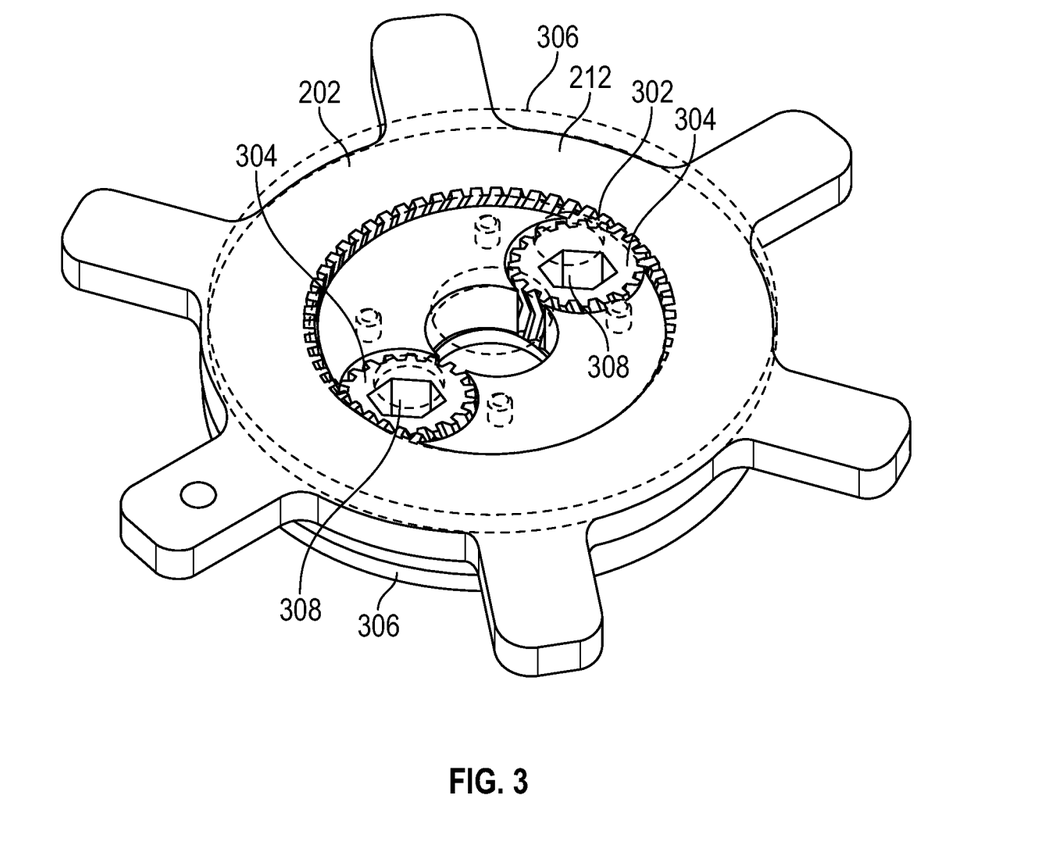
FIG. 3 illustrates an alignment device, in accordance with one embodiment.

FIG. 3 provides an enlarged pictorial view of an example alignment device 202 to draw two components together in an aligned fashion. The alignment device 202 comprises a planetary gear set 302. The planetary gear set 302 comprises a ring gear 212 gear and at least two planetary gears 304. One or more side plates 306 provide a housing for the planetary gear set 302 and support the ring gear 212 and the planetary gears 304. In the illustrated example, each of the two planetary gears 304 includes an aperture 308 sized and shaped to receive a threaded fastener (such as a nut 402, FIG. 4) for threaded engagement with a respective one of the threaded rods 210 connected to the showerhead 104 as described further above. As will be appreciated, manual rotation of the ring gear 212 imparts synchronized rotational movement to the two planetary gears 304 and each aperture 308 therein. Each nut 402 located in a respective aperture 308 is caused to rotate accordingly about its threaded rod 210 to cause linear advancement of the alignment device 202 along the two threaded rods 210. The linear movement draws an attached cooling plate 204, held captive by the alignment device 202, towards (or away from) a showerhead 104 in an aligned fashion with their mating faces held substantially parallel to each other.

Figure 4:
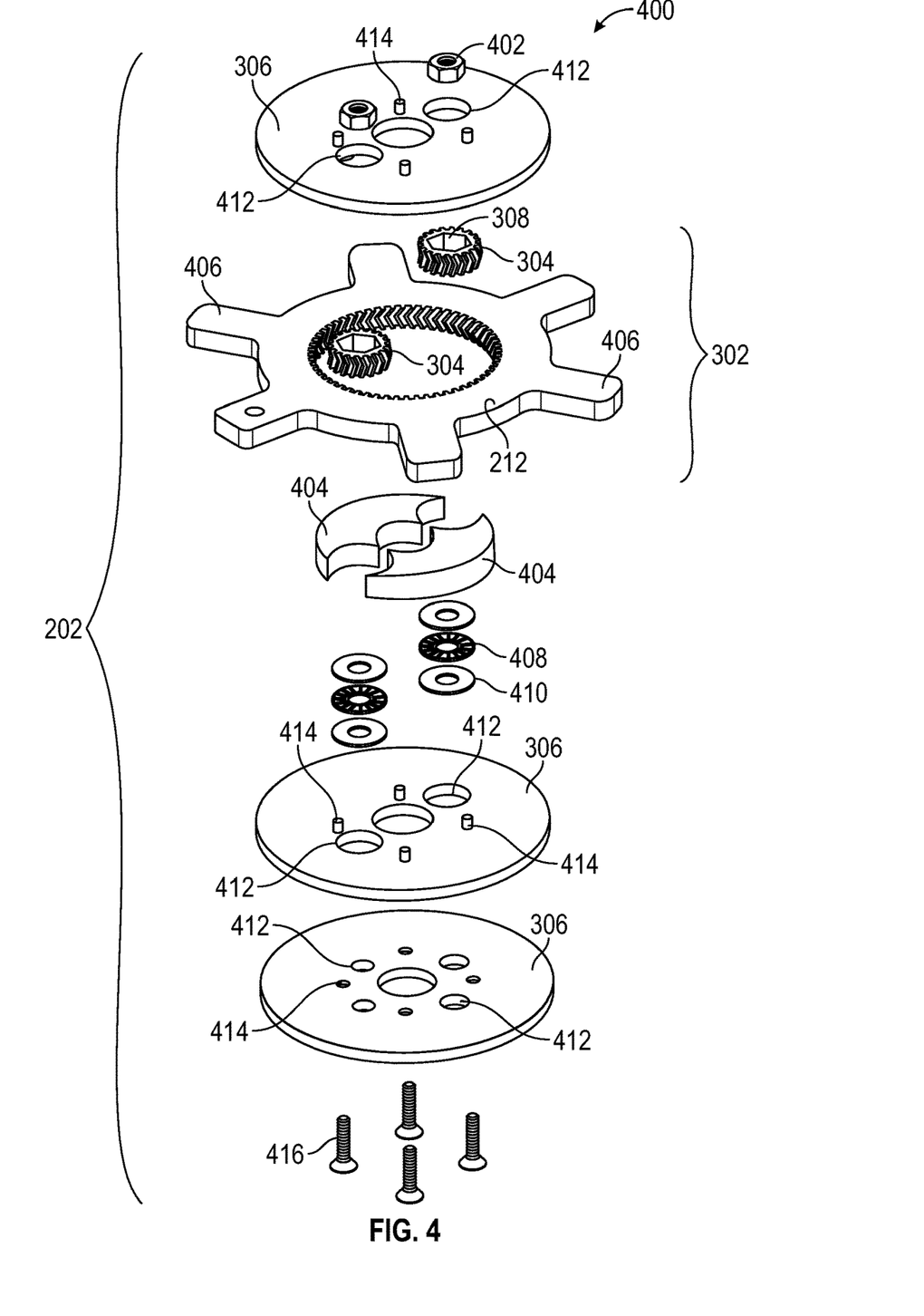
FIG. 4 illustrates an exploded view of an alignment device, in accordance with one embodiment.

FIG. 4 provides an exploded view of an example alignment device 202. As described above, the alignment device 202 comprises a planetary gear set 302. The planetary gear set 302 comprises a ring gear 212 gear and at least two planetary gears 304. One or more side plates 306 provide a housing for the planetary gear set 302 and support the ring gear 212 and the planetary gears 304. In some examples, the side plates 306 are designed for convenient fabrication from sheet stock. In the illustrated example, each of the two planetary gears 304 includes an aperture 308 sized and shaped to receive a threaded fastener (such as a nut 402, FIG. 4) for threaded engagement with a respective one of the threaded rods 210 connected to the showerhead 104. A pair of clamped shoe retainers 404 is configured to support the two planetary gears 304 for rotation inside the ring gear 212 and around a respective one of the two threaded rods 210. In the example exploded view 400, the arrangement of the shoe retainers 404 and the planetary gear set 302 does not require provision of a sun gear as is sometimes evident in conventional planetary gear set arrangements. In some present examples, the ring gear 212 and two planetary gears 304 include self-aligning herringbone gears, as shown. The side plates 306 of the alignment device 202 may be secured together by screws or rivets (not shown). Other arrangements are possible.

In some examples, the ring gear 212 includes one or more manually engageable formations 406 or tabs provided on a periphery thereof for rotating the ring gear by hand to advance or retract the alignment device 202 along the threaded rods 210. In some examples, the alignment device 202 comprises one or more thrust bearings 408 and washers 410 to support a weight of one of the two components (the showerhead 104 or cooling plate 204), or to transmit an axial force generated by the alignment device 202 device upon rotation of the ring gear 212 to one of the two components. The thrust bearings 408 transfer load to under layers of the alignment device 202 while allowing the nuts 402 to spin freely.

In some examples, the one or more side plates 306 includes first apertures 412 to allow passage therethrough of the two threaded rods 210, and one or more second apertures 414 to allow passage of securement fasteners 416 to secure the two components together. In some examples, the first apertures 412 and second apertures 414 are of the same size and thread such that threaded rods 210 and securement fasteners 416 can utilize the same holes. This convenient arrangement allows, for example, the threaded rods 210 to be passed through the first apertures 412 and the nuts 402 in the planetary gears 304 and secured in the complementary threaded holes 208 in the showerhead stem 206, leaving the second apertures 414 free to accept the securement fasteners 416 therethrough when the showerhead 104 and cooling plate 204 have been drawn together. This also avoids the necessity of having to withdraw the threaded rods 210 prior to safe securement of the two components or to add additional threaded holes 208 in the showerhead stem 206 or the cooling plate 204, for example. In other words, the first apertures 412 or second apertures 414 allow final installation fasteners (for example, the securement fasteners 416) to be dropped in and tightened without removing the alignment device 202 beforehand.

Figure 5:
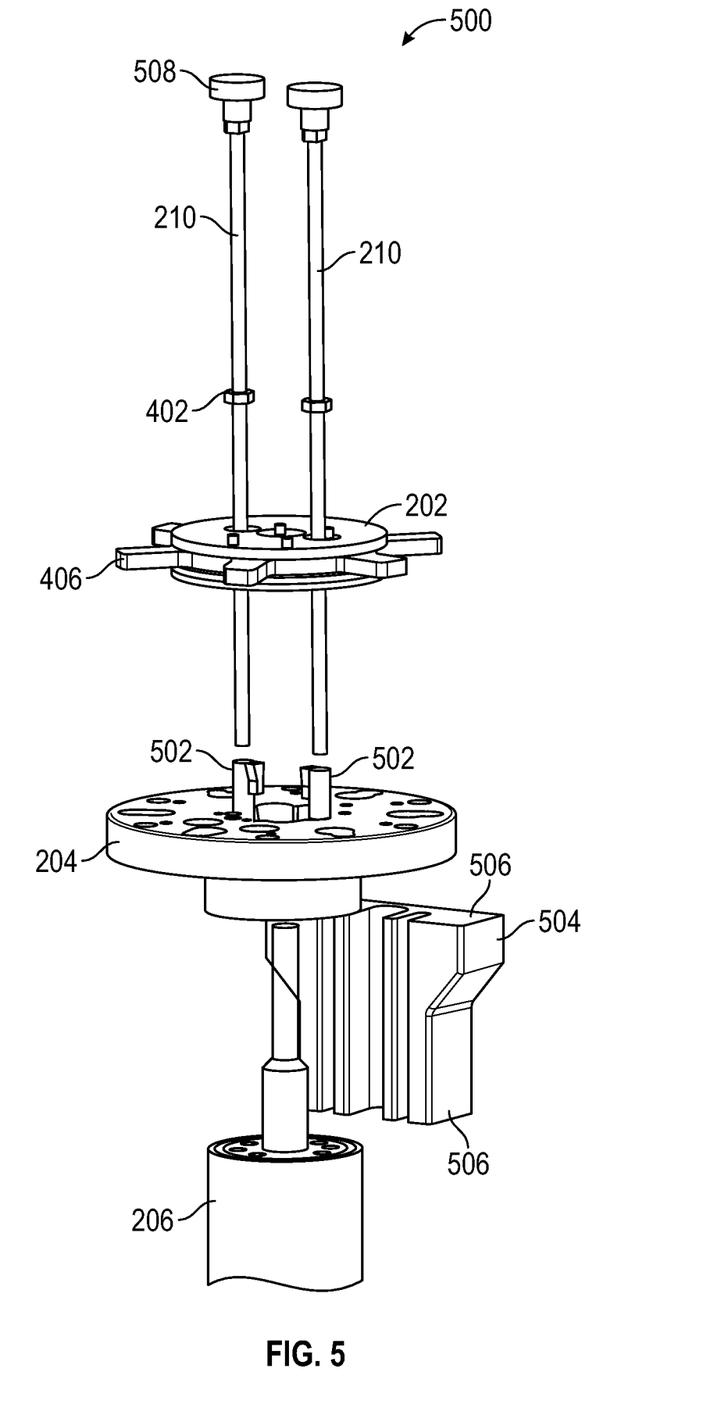
FIG. 5 illustrates an alignment toolkit, in accordance with one embodiment.

With reference to FIG. 5, some examples herein include an alignment toolkit 500 to facilitate drawing two components, such as a showerhead 104 and cooling plate 204, together in aligned fashion. In some examples, the threaded rods 210 include knurled handles 508 for a quick thread-in of the threaded rods 210 through the alignment device 202 into the showerhead 104 (more specifically the showerhead stem 206) to enable a "rough" alignment of these two components without "precise" use yet of the alignment device 202.

In some examples, the alignment toolkit 500 comprises at least two threaded rods 210 each engageable with one of the two components, in this case the showerhead stem 206 (for example, in the manner shown in FIG. 2). The alignment toolkit 500 further includes an alignment device 202. The alignment device 202 may include any one or more of the features described above. In some examples, the alignment device 202 transfers the weight of the showerhead 104 to the cooling plate 204 during installation and securement along a same load path as exists during normal usage in operation of the processing chamber 102.

The alignment toolkit 500 may further comprise one or more threaded-rod guides 502 for engagement with one of the two components, in this example the cooling plate 204. The threaded-rod guides 502 help to support and guide the threaded rods 210 as the showerhead 104 (or more specifically the showerhead stem 206) is drawn up under operation of the alignment device 202 to mate with a lower surface of the cooling plate 204. The threaded-rod guides 502 can be inserted into the cooling plate 204 to vertically align and center the threaded rods 210 and protect the cooling plate 204 surfaces from damage by the threaded rods 210. In some examples, the alignment toolkit 500 further comprises an alignment checker 504 or flatness checker to check or confirm an alignment of the two components as they are drawn together. The alignment checker 504 can check or confirm a parallelism of thermal faces of the two components when needed. The alignment checker 504 may include opposed flat surfaces 506 which have been previously calibrated or aligned to enable a predetermined matching alignment of the showerhead 104 and cooling plate 204, for example.

Figure 6:
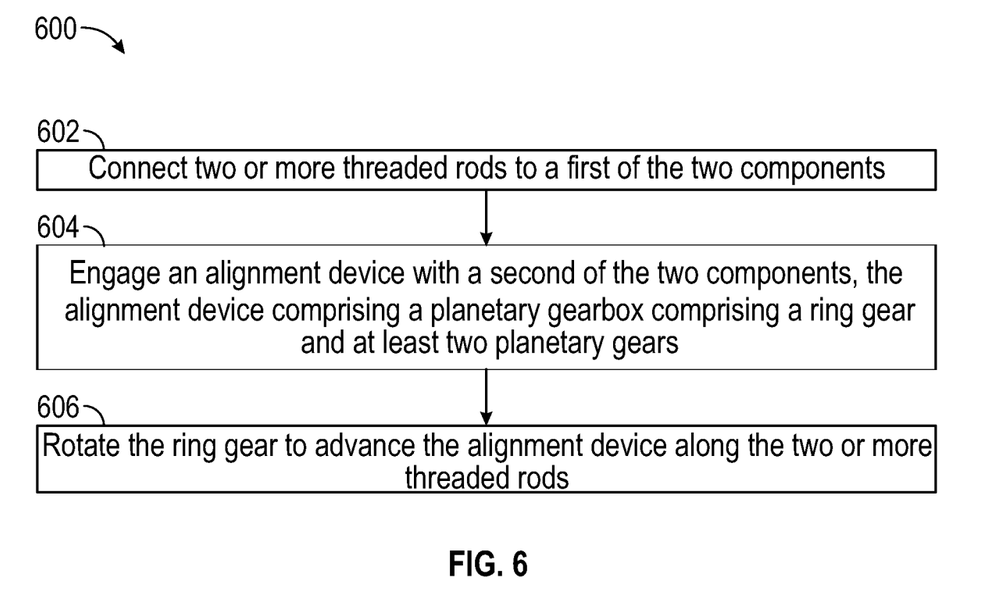
FIG. 6 illustrates a method, in accordance with one embodiment.

Some present examples include methods. With reference to FIG. 6, operations in a method 600 of aligning two components to be drawn together are shown in flow chart form. In operation 602, method 600 includes connecting two or more threaded rods to a first of the two components. In operation 604, method 600 includes engaging an alignment device with a second of the two components, the alignment device comprising a planetary gearbox comprising a ring gear and at least two planetary gears, the alignment device comprising one or more side plates for supporting the ring gear and the at least two planetary gears, wherein each of the at least two planetary gears includes an aperture sized to receive a threaded fastener for engagement with one of the two or more threaded rods, wherein rotation of the ring gear imparts synchronized rotational movement to the threaded fasteners to cause linear advancement of the alignment device along the two or more threaded rods. In operation 606, method 600 includes rotating the ring gear to advance the alignment device along the two or more threaded rods.

Some examples of method 600 further comprise engaging a threaded-rod guide with one of the two components. Some examples of method 600 further comprise using an alignment checker to check or confirm an alignment of the two components as they are drawn together.

In some examples of method 600, the alignment device further comprises a pair of shoe retainers for supporting the at least two planetary gears. In some examples of method 600, the pair of shoe retainers is configured to support the at least two planetary gears for rotation inside the ring gear and around a respective one of the at least two threaded rods, devoid of a sun gear. In some examples of method 600, the alignment device is portable, and the ring gear includes one or more manually engageable formations provided on a periphery thereof for rotating the ring gear by hand to advance the device along the threaded rods, and wherein the method 600 further comprises rotating the ring gear by hand to advance the alignment device along the threaded rods. In some examples of method 600, the alignment device further comprises one or more thrust bearings to support a weight of one of the two components or to transmit an axial force generated by the alignment device upon rotation of the ring gear to one of the two components. In some examples of method 600, the one or more side plates of the alignment device include first apertures to allow passage therethrough of the respective threaded rods and one or more second apertures to allow passage of a securement fastener to fasten the two components together, and the method 600 further comprises passing a securement fastener through one of the second apertures and fastening the two components together. In some examples of method 600, the ring gear and at least two planetary gears of the alignment device include herringbone gears. In some examples, three-dimensional (3D) printed herringbone gears offer ~4:1 reduction ratio to minimize lift effort and are self-aligning for smooth motion.

Although examples have been described with reference to specific example embodiments or methods, it will be evident that various modifications and changes may be made to these embodiments without departing from the broader scope of the embodiments. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This detailed description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. An alignment device to draw two components together, the alignment device comprising:
   a planetary gear set, the planetary gear set comprising a ring gear and at least two planetary gears;
   one or more side plates for supporting the ring gear and the at least two planetary gears;
   wherein each of the at least two planetary gears includes an aperture sized to receive a threaded fastener for engagement with a respective one of at least two threaded rods engaged with one of the two components, wherein rotation of the ring gear imparts synchronized rotational movement to the threaded fasteners to cause linear movement of the alignment device relative to the at least two threaded rods, and wherein a first component of the two components includes a showerhead and a second component of the two components includes a cooling plate.

2. The alignment device of claim 1 wherein the alignment device is portable; and
   wherein the ring gear includes one or more manually engageable formations provided on a periphery thereof for rotating the ring gear by hand to move the alignment device relative to the at least two threaded rods.

3. The alignment device of claim 1, further comprising one or more thrust bearings to support a weight of one of the two components or to transmit an axial force generated by the alignment device upon rotation of the ring gear to one of the two components.

4. The alignment device of claim 1, wherein the one or more side plates include first apertures to allow passage therethrough of the at least two threaded rods, and one or more second apertures to allow passage of a securement fastener to fasten the two components together.

5. The alignment device of claim 1, wherein the ring gear and at least two planetary gears include herringbone gears.

6. The alignment device of claim 1 further comprising a pair of shoe retainers for supporting the at least two planetary gears.

7. The alignment device of claim 6 wherein the pair of shoe retainers is configured to support the at least two planetary gears for rotation inside the ring gear and around a respective one of the at least two threaded rods, devoid of a sun gear.

8. An alignment toolkit to facilitate drawing two components together in aligned fashion, the toolkit comprising:
at least two threaded rods each engageable with one of the two components; and
an alignment device, the alignment device comprising:
a planetary gear set, the planetary gear set comprising a ring gear and at least two planetary gears;
one or more side plates for supporting the ring gear and the at least two planetary gears;
wherein each of the at least two planetary gears includes an aperture sized to receive a threaded fastener for engagement with a respective one of the at least two threaded rods, wherein rotation of the ring gear imparts synchronized rotational movement to the threaded fasteners to cause linear movement of the alignment device relative to the at least two threaded rods, and wherein a first component of the two components includes a showerhead and a second component of the two components includes a cooling plate.

9. The toolkit of claim 8, further comprising a threaded-rod guide for engagement with one of the two components.

10. The toolkit of claim 8, further comprising an alignment checker to check or confirm an alignment of the two components as they are drawn together.

11. The toolkit of claim 8, wherein the alignment device is portable; and
wherein the ring gear includes one or more manually engageable formations provided on a periphery thereof for rotating the ring gear by hand to move the alignment device relative to the at least two threaded rods.

12. The toolkit of claim 8, wherein the alignment device further comprises one or more thrust bearings to support a weight of one of the two components, or to transmit an axial force generated by the alignment device upon rotation of the ring gear to one of the two components.

13. The toolkit of claim 8, wherein the one or more side plates of the alignment device include first apertures to allow passage of the respective threaded rods, and one or more second apertures to allow passage of a securement fastener to fasten the two components together.

14. The toolkit of claim 8, wherein the ring gear and at least two planetary gears of the alignment device include herringbone gears.

15. The toolkit of claim 8, wherein the alignment device further comprises a pair of shoe retainers for supporting the at least two planetary gears.

16. The toolkit of claim 15, wherein the pair of shoe retainers is configured to support the at least two planetary gears for rotation inside the ring gear and around a respective one of the at least two threaded rods, devoid of a sun gear.

17. A method of aligning two components to be drawn together, the method comprising:
connecting two or more threaded rods to a first of the two components;
engaging an alignment device with a second of the two components, the alignment device comprising a planetary gear set comprising a ring gear and at least two planetary gears, the alignment device comprising one or more side plates for supporting the ring gear and the at least two planetary gears, wherein each of the at least two planetary gears includes an aperture sized to receive a threaded fastener for engagement with one of the two or more threaded rods, wherein rotation of the ring gear imparts synchronized rotational movement to the threaded fasteners to cause linear movement of the alignment device relative to the two or more threaded rods, and wherein a first component of the two components includes a showerhead and a second component of the two components includes a cooling plate; and
rotating the ring gear to move the alignment device relative to the two or more threaded rods.

18. The method of claim 17, further comprising engaging a threaded-rod guide with one of the two components.

19. The method of claim 17, further comprising using an alignment checker to check or confirm an alignment of the two components as they are drawn together.

20. The method of claim 17, wherein the alignment device is portable; and
wherein the ring gear includes one or more manually engageable formations provided on a periphery thereof for rotating the ring gear by hand to advance the device along the two or more threaded rods; and
wherein the method further comprises rotating the ring gear by hand to move the alignment device along the two or more threaded rods.

21. The method of claim 17, wherein the alignment device further comprises one or more thrust bearings to support a weight of one of the two components, or to transmit an axial force generated by the alignment device upon rotation of the ring gear to one of the two components.

22. The method of claim 17, wherein the one or more side plates of the alignment device include first apertures to allow passage therethrough of the two or more threaded rods, and one or more second apertures to allow passage of a securement fastener to fasten the two components together; and
wherein the method further comprises passing a securement fastener through one of the second apertures and fastening the components together.

23. The method of claim 17, wherein the ring gear and at least two planetary gears of the alignment device include herringbone gears.

24. The method of claim 17, wherein the alignment device further comprises a pair of shoe retainers for supporting the at least two planetary gears.

25. The method of claim 24, wherein the pair of shoe retainers is configured to support the at least two planetary gears for rotation inside the ring gear and around a respective one of the two or more threaded rods, devoid of a sun gear.

26. A method of aligning two components to be drawn together, the method comprising:
connecting two or more threaded rods to a first of the two components;
engaging an alignment device with a second of the two components, the alignment device comprising a planetary gear set comprising a ring gear and at least two planetary gears, the alignment device comprising one or more side plates for supporting the ring gear and the at least two planetary gears, wherein each of the at least two planetary gears includes an aperture sized to receive a threaded fastener for engagement with one of the two or more threaded rods, wherein rotation of the ring gear imparts synchronized rotational movement to the threaded fasteners to cause linear movement of the alignment device relative to the two or more threaded rods;

rotating the ring gear to move the alignment device relative to the two or more threaded rods, and using an alignment checker to check or confirm an alignment of the two components as they are drawn together.

\* \* \* \* \*